United States Patent [19]
Needham

[11] Patent Number: 5,978,946
[45] Date of Patent: Nov. 2, 1999

[54] METHODS AND APPARATUS FOR SYSTEM TESTING OF PROCESSORS AND COMPUTERS USING SIGNATURE ANALYSIS

[75] Inventor: Wayne Maurice Needham, Gilbert, Ariz.

[73] Assignee: Intel Coporation, Santa Clara, Calif.

[21] Appl. No.: 08/962,160

[22] Filed: Oct. 31, 1997

[51] Int. Cl.$^6$ ............................................. G01R 31/28
[52] U.S. Cl. ............................................. 714/732
[58] Field of Search ................................. 714/732, 724, 714/43, 44, 25, 47

[56] References Cited

U.S. PATENT DOCUMENTS

| | | | |
|---|---|---|---|
| 4,520,440 | 5/1985 | Buonomo et al. | 714/736 |
| 4,864,570 | 9/1989 | Savaglio et al. | 714/732 |
| 5,301,199 | 4/1994 | Ikenaga et al. | 714/733 |
| 5,583,786 | 12/1996 | Needham | 364/488 |
| 5,608,867 | 3/1997 | Ishihara | 714/47 |

OTHER PUBLICATIONS

*Designer's Guide to Testable ASIC Devices,* Wayne Maurice Needham, (Van Nostrand Reinhold, New York, 1991), pp. vii–x and 10–15, 34–37, 63–178.

*Primary Examiner*—Hoa T. Nguyen
*Attorney, Agent, or Firm*—Blakely, Sokoloff, Taylor & Zafman LLP

[57] ABSTRACT

In one aspect of the present invention, an apparatus is provided for testing a processor running a software program. The apparatus includes a bus having control, data and address lines and a device assigned at least one address. The bus connects the device to the processor. The apparatus includes a multiple input signature register having a plurality of parallel input terminals connected to the data lines. The apparatus includes a control unit having first and second input terminals connected to the address and control lines respectively. The control unit is adapted to enabling the parallel input terminals of the multiple input signature register in response to detecting on the address and control lines at least one preselected triggering event executed by the software program to a preselected address of the device. The apparatus includes a signature comparator adapted to comparing a test signature number from the multiple input signature register to a reference signature number.

30 Claims, 6 Drawing Sheets

METHODS AND APPARATUS FOR SYSTEM TESTING OF PROCESSORS AND COMPUTERS USING SIGNATURE ANALYSIS

BACKGROUND OF THE INVENTION

1. Field of the Invention

This invention relates generally to a method and apparatus for testing computers and processors during manufacture, and more particularly, to a method and apparatus for using software and signature analysis tools to perform tests.

2. Description of the Related Art

The testing process is an important part of the manufacture of micro-processors and computers. A modern processor may have over three million transistors and even more internal connections. In devices of such complexity, it is difficult to test all combinations of data and operations of the device and to ensure the absence of defects therein.

FIG. 1 shows a simple processor 18 that will be employed to illustrate a "faulty unit" signature test. The processor 18 is composed of several units, including: an arithmetic logic unit (ALU) 20, an address translation unit (ATU) 22, a floating point unit (FPU) 24, and an instruction decode unit (IDU) 26. The ALU 20, ATU 22, FPU 24, and IDU 26, have a number of control and/or data connections 28, 30, 32. A bus unit 34 connects the processor 18 to memory and input/output ports (I/O) (both not shown). The units 20, 22, 24, 26 of the processor 18 communicate with the memory and I/O by bus lines 36, 38.

FIG. 2 illustrates a prior art test apparatus 50 for performing a signature based "faulty unit" test on the processor 18 of FIG. 1. Each functional unit 20, 22, 24, 26 of the processor 18 is individually connected to parallel input terminals (not shown) of a multiple input signature register (MISR) 42, 44, 46, 48. Each MISR 42, 44, 46, 48 ordinarily has one parallel input terminal for each output terminal of the functional unit 20, 22, 24, 26 connected thereto (not shown). During the test, each MISR 42, 44, 46, 48 accumulates data from the associated functional unit 20, 22, 24, 26 in response to receiving a clock pulse on a line 59 connected to a clock 49. The MISR's 42, 44, 46, 48 add new data to data stored during prior clock pulses through an operation that is specified by a preselected polynomial and that reproducibly gives a single signature number.

The signature number ordinarily has one binary bit for each parallel input terminal, and each bit thereof is affected by data from all parallel input terminals of the MISR. Signature testing uses the signature number like a parity bit. The signature number is compared to a reference signature number, and an error is reported if any bit does not match. For signature numbers having many bits, the risk of "aliasing" or false matches is reduced, because the probability of aliasing is approximately $2^{-D}$ where D is the number of bits of the signature number provided that the polynomial is constructed correctly.

Since each of the functional units 22, 24, 26, 28 of the processor 18 is connected directly to a separate MISR 42, 44, 46, 48, the test apparatus 50 concurrently and individually tests the various functional units 22, 24, 26, 28, of the processor 18. The MISR's 42, 44, 46, 48 have serial input terminals 51, 52, 53, 54 and output terminals 55, 56, 57, 58 for inputting initial signature patterns and outputting final signature numbers. The MISR's 42, 44, 46, 48 also have control lines 60 for controlling respective input terminals, output terminals, and data accumulation. The test apparatus 50 may be permanently embedded on the die holding the processor 18 itself.

FIG. 3 illustrates a prior art method 61 for performing a "faulty unit" test with the test apparatus 50 of FIG. 2. At a block 62, the sequential logic units (not shown), of each MISR 42, 44, 46, 48 are initialized to a predetermined state by serially inputting initial patterns through the input lines 51, 52, 53, 54. Though the exact form of the initial state is not essential, the reproducibility of the initial state is essential to the test method 61. At block 64, a second set of initial patterns, e.g., data and instructions, is placed in the sequential circuit elements such as registers, flip-flops, latches and buffers (not shown) of the functional units 20, 22, 24, 26 of the processor 18 itself. Typically, the initial patterns are placed in the functional units 20, 22, 24, 26 from input/output ports (not shown) and external devices (not shown) connected to the bus 36. Several clock cycles may be employed to set up the initial patterns in the processor 18 and MISR's 42, 44, 46, 48.

After setting up the initial state, signature data collection proceeds in loop-like fashion. At block 66, the processor 18 runs for a preselected number of clock cycles. Then, at block 68, the parallel input terminals of the MISR's 42, 44, 46, 48 are enabled by control signals on the lines 60, and data is taken from the functional units 22, 24, 26, 28 connected to each MISR 42, 44, 46, 48. At block 70, the input data is added to the data already stored in the individual MISR's 42, 44, 46, 48 in response to receipt of a pulse from the clock 49 on the clock lines 59. The cycles of running the processor 18, enabling the parallel input terminals of the MISR's 42, 44, 46, 48, and adding new data to data already stored in the MISR's 42, 44, 46, 48 as shown in blocks 66, 68, 70 are repeated for a predetermined number of clock cycles as measured by the clock 49. The cycles of data taking produce a single signature number at any time in each MISR 42, 44, 46, 48. After the predetermined number of clock cycles selected for the test, the signature number from each MISR 42, 44, 46, 48 is serially read from the output terminals 55, 56, 57, 58.

Since the initial states, cycle lengths, and number of data taking cycles are reproducibly controlled, the output signal of each MISR 42, 44, 46, 48 is a reproducible signature number. At block 72, the signature number from each MISR 42, 44, 46, 48 is compared with a reference signature number that would result from performing the same test on a properly functioning processor 18 of the same type. As block 74 illustrates the reference signature number is determined empirically by performing the test on a "good" processor 18 prior to performing any tests on "unknown" processors 18. If the signature number from the test does not match the reference signature number, the functional unit 22, 24, 26, 28 of the processor associated with the non-matching number is not operating correctly, and the processor 18 fails the test. If the test and reference signature numbers match, the associated processor 18 passes the test.

Though the "faulty unit" test detects many defects, the test cannot detect all defects that may be present in the processor. In particular, the "faulty unit" test focuses on defects of individual functional units 22, 24, 26, 28 of the processor 18. Typically, more than 99.9 percent of all processors that pass the "faulty unit" test may be defect free. Nevertheless, processors are expensive devices and quality control to a fraction of 0.1 percent is not sufficient for the high standards of the computer industry.

The "faulty unit" test and equivalent tests may miss system-level defects that lead to occasional problems when the processor runs software operating systems such as WINDOWS®, UNIX®, a disk operating system (DOS), or applications such as EXCEL®, WORD®, or paint programs and custom software written to check certain features. The system-level defects are not typically associated with one functional 20, 22, 24, 26 unit of the processor 18. Thus, the "faulty unit" test often is unable to detect them. Unfortunately, using the high level software itself to detect the system-level defects is also problematic, because complex software performs a variety of non-reproducible acts such as reading disks, responding to interrupt requests and reading system clocks in the course of normal operation. If the software performs non-reproducible acts, the output signals produced by running the software are not directly amenable to the detailed comparisons inherent in simple signature tests. Finally, tests for system-level defects that employ high level software without signature analysis are extremely time consuming and costly. Thus, industry standards demand the detection and elimination of processors having system-level, manufacturing defects, because such defects interfere with operating modern operating systems. Nevertheless, the present forms of inexpensive signature testing do not detect such defects.

The present invention is directed to overcoming, or at least reducing the effects of, one or more of the problems set forth above.

SUMMARY OF THE INVENTION

In one aspect of the present invention, an apparatus is provided for testing a processor running a software program. The apparatus includes a bus having control, data and address lines and a device assigned at least one address. The bus connects the device to the processor. The apparatus includes a multiple input signature register having a plurality of parallel input terminals connected to the data lines. The apparatus includes a control unit having first and second input terminals connected to the address and control lines respectively. The control unit is adapted to enabling the parallel input terminals of the multiple input signature register in response to detecting on the address and control lines at least one preselected triggering event executed by the software program to a preselected address of the device. The apparatus includes a signature comparator adapted to comparing a test signature number from the multiple input signature register to a reference signature number.

BRIEF DESCRIPTION OF THE DRAWINGS

Other objects and advantages of the invention will become apparent upon reading the following detailed description and upon reference to the drawings in which.

Figure 1:
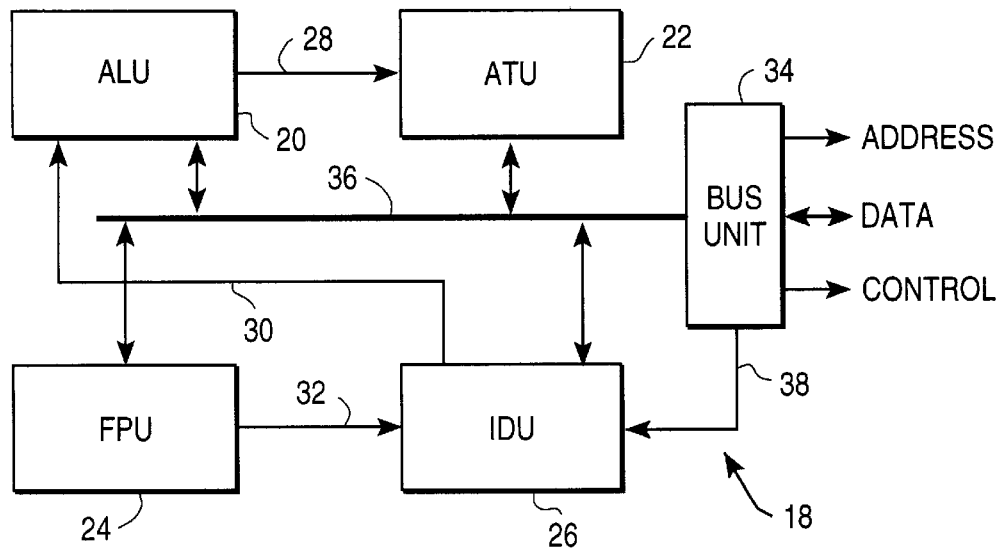
FIG. 1 illustrates a exemplary processor.
Figure 2:
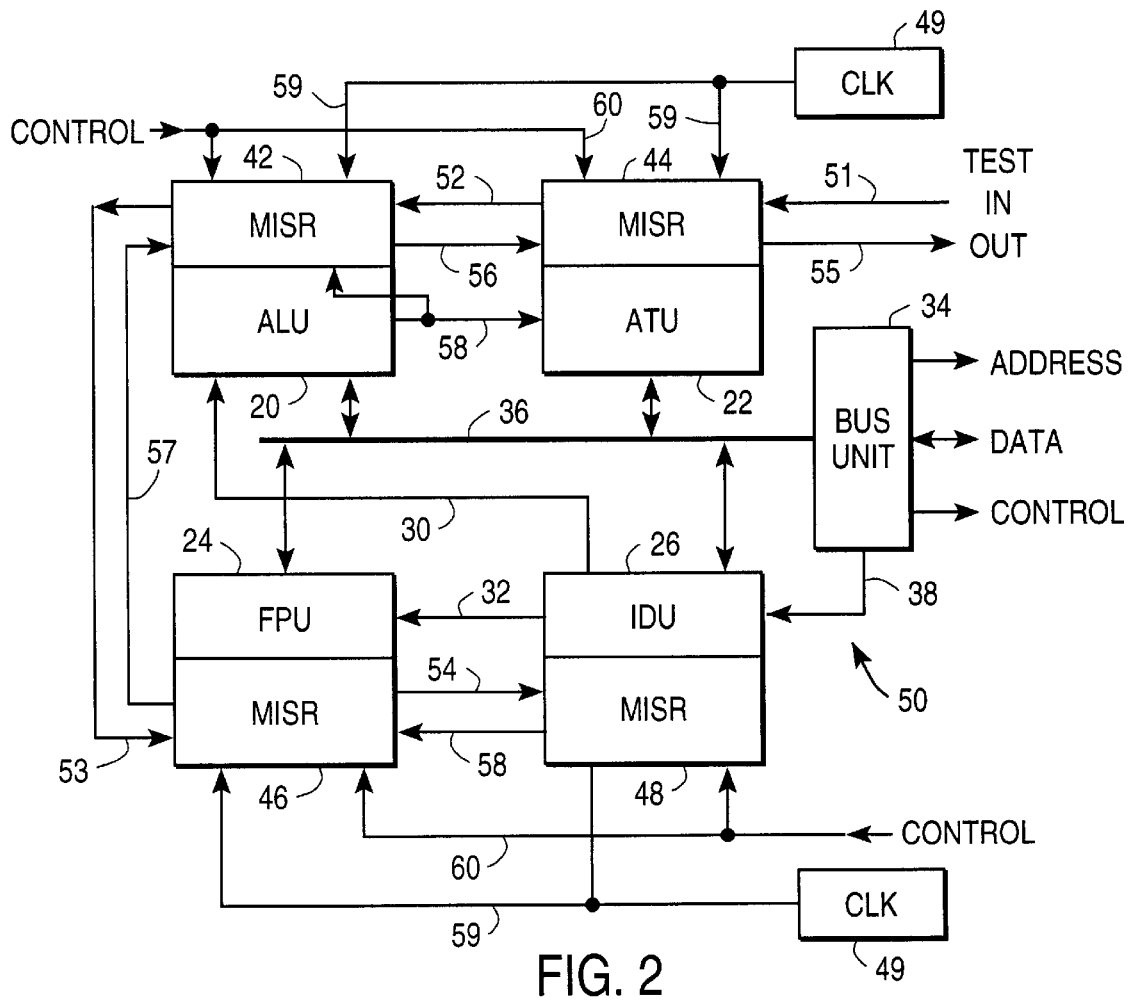
FIG. 2 illustrates a prior art apparatus for performing signature analysis tests on the processor of FIG. 1.
Figure 3:
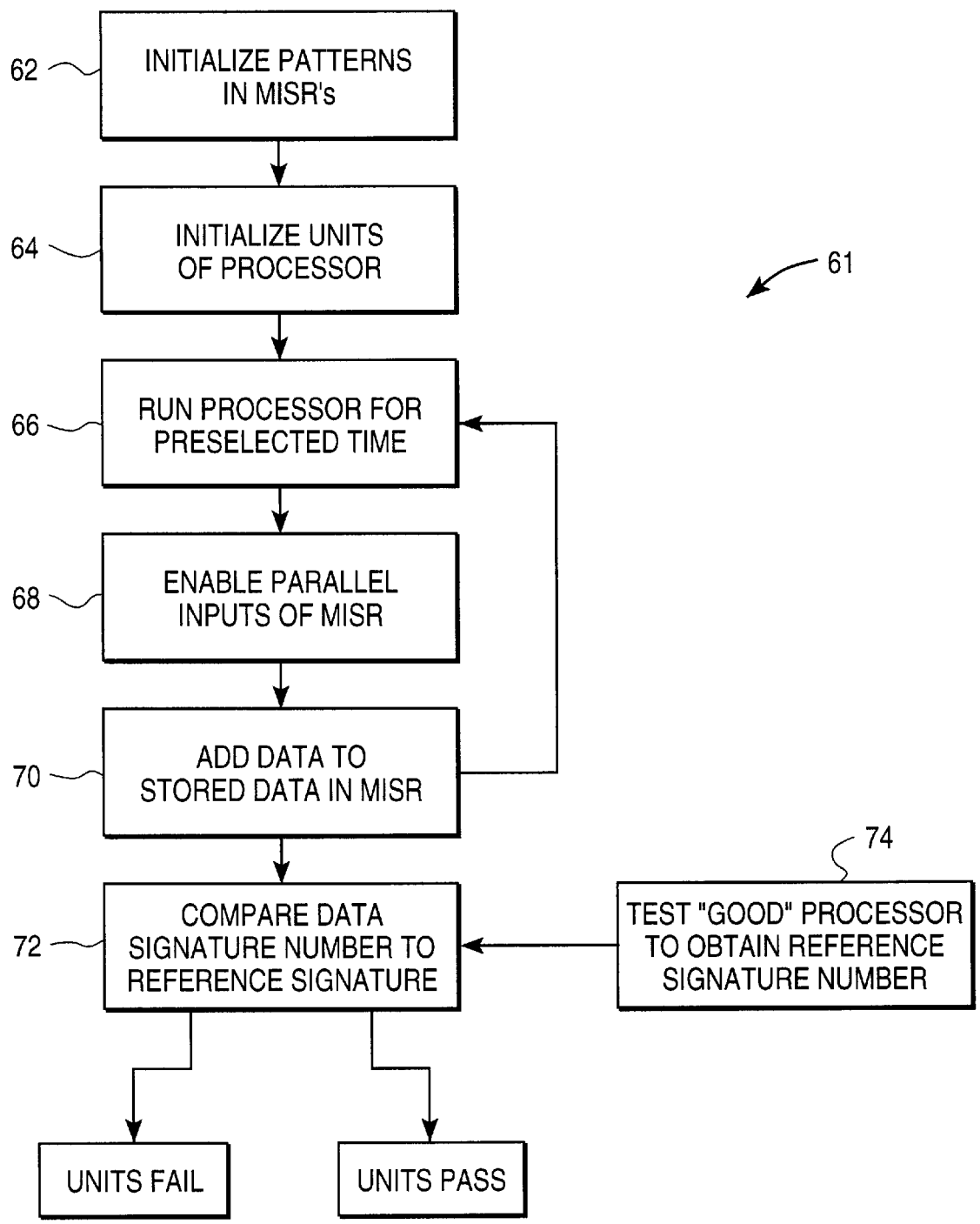
FIG. 3 is a flowchart illustrating a prior art method for performing signature analysis with the apparatus of FIG. 2.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Specific embodiments include apparatus and methods for performing the signature analysis of a processor at the system-level. Specific embodiments test the processor as a whole by performing testing in combination with running a complex program on the processor and by collecting test data from the processor as a unit while the program is operating. This should be compared to the "faulty unit" test that is performed on specific units within the processor and does not entail collecting test data while a complex program runs on the processor. Some embodiments may further combine the system-level signature analysis test and a prior art "faulty unit" test.

A processor may perform greater than 100 million operations per second while running complex software such as WINDOWS®, EXCEL®, a disc operating system (DOS), or other software employing a graphical user interface. Therefore, testing the processor while such a program runs is more likely to thoroughly test the several million transistors and connections that form the device. The specific embodiments for system-level signature testing employ software such as WINDOWS®, EXCEL®, ACCESS® or other complex software, for example software allowing a graphical user interface (GUI) such as electronic games and spreadsheet programs. Such software requires substantial storage space and is not ordinarily completely stored in random access memory. Thus, a test based on such software will usually encounter non-reproducible processor acts because of latencies associated with read/write accesses to discs, compact discs or tapes. The particular software used is not essential, and different choices may be employed in alternate embodiments. The software for the system-level test is chosen by empirical methods. Preferably, the software has been found to occasionally encounter run problems on some processors of the variety to be tested. Run problems that occur on a small percentage of processors of any particular type may be empirically attributed to rare system-level defects of the processors that occur in manufacture. Such "problematic" software may be advantageous in methods and apparatus for detecting system-level processor defects.

The embodiments for system-level signature testing use data from reproducible processor activity. Test data taking avoids non-reproducible latencies and random activities associated with, for example, accessing hard disks, responding to interrupt commands, generating random numbers, or reading system time clocks. To eliminate the non-reproducible processor activities, the embodiments only take test data on certain preselected triggering events. The triggering events for test data taking are typically bus transactions and may include read or write acts to main memories, other acts performed from or to main memory addresses, read or write commands from or to input/output (I/O) devices having assigned addresses, etc. The triggering events need to signal the start of a period in which acts can be reproduced, in tests on properly functioning processors, as measured by some convenient time windows, i.e. a fixed numbers of clock pulses, bus transactions, read/write acts, etc.

Figure 4:
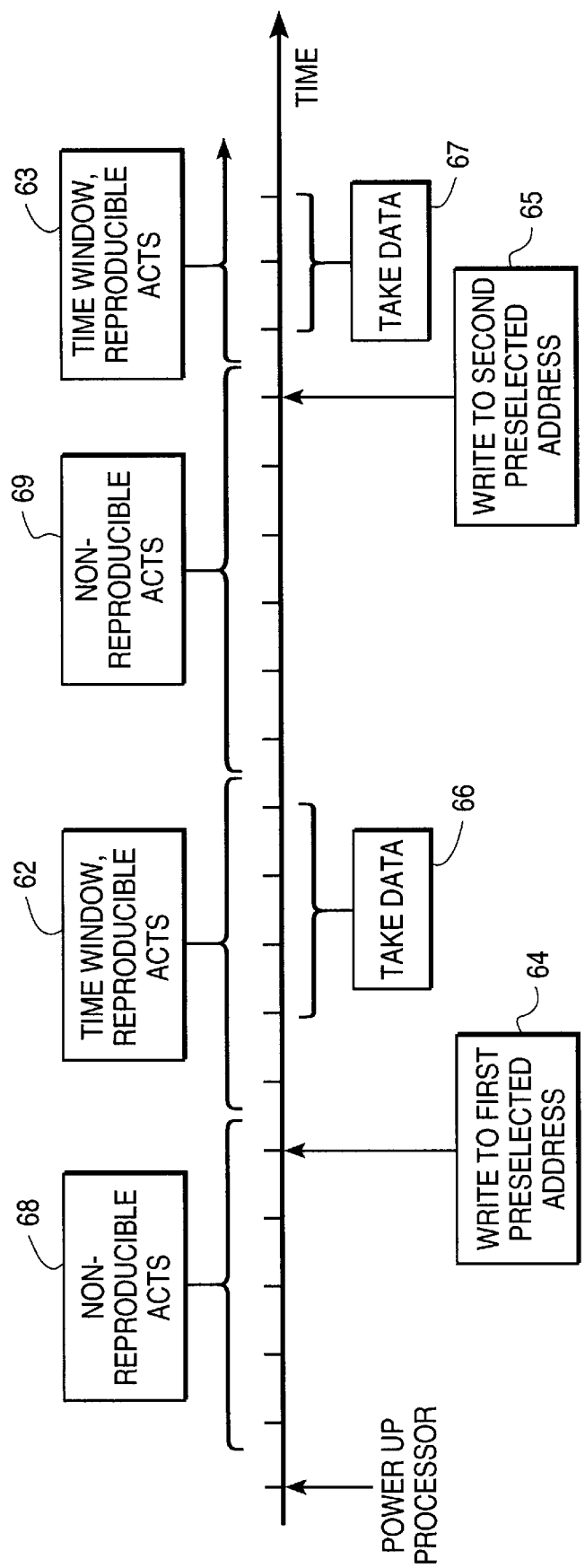
FIG. 4 illustrates the time intervals of reproducible and non-reproducible processor activity.

As FIG. 4 illustrates specific embodiments choose time windows 62, 63 following write acts to preselected memory addresses 64, 65 (or other preselected bus transactions that may be used for triggering events as discussed above) for test data taking 66, 67. The time windows for data taking may, in some embodiments, be a small fraction of the time that the software runs on the processor during the testing. The time windows 62, 63 are chosen based on knowledge that the processor performs reproducible acts therein while running the complex software employed for the system-level test. Some specific embodiments may also disable the processor interrupt response during the portions of the time windows 62, 63 where data is taken 66, 67 to ensure that interrupts do not cause non-reproducible processor acts. During other time periods 68, 69, the processor, under test, may perform non-reproducible acts. Typically, the reproducible nature of acts during the chosen time windows 62, 63 is ascertained empirically by running trial signature tests on processors that are known to function properly and by verifying that the signature data accumulated is reproducible. Non-reproducible write acts (or other bus transactions that may be used for triggering events as disclosed above) should be eliminated from the portions of the time windows 62, 63 chosen for data taking 66, 67 either by the above-disclosed methods or by other methods known to persons of ordinary skill in the art.

Figure 5:
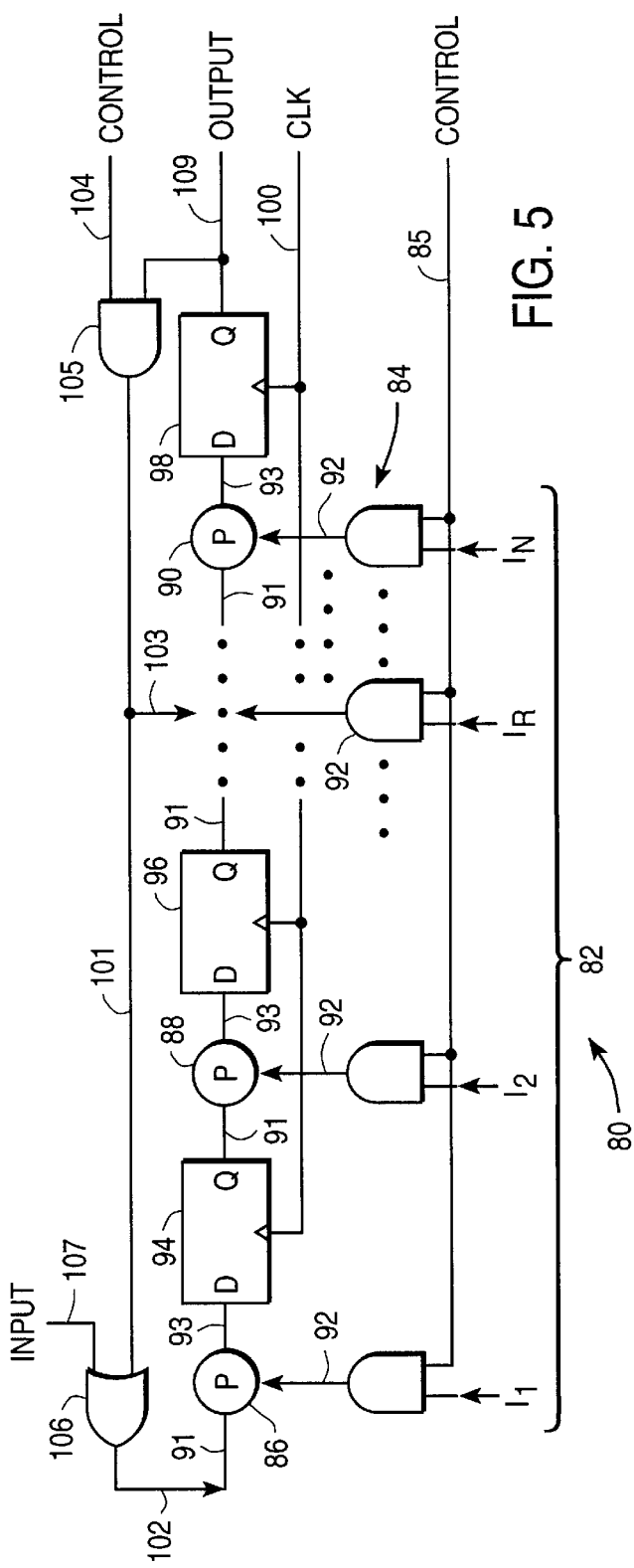
FIG. 5 illustrates a multiple input signature register.

FIG. 5 illustrates a multiple input signature register (MISR) 80. The MISR 80 has N parallel input terminals $I_1$, $I_2$, ... $I_R$, ..., $I_N$ in 82. The parallel input terminals 82 connect to first input terminals of a bank of AND gates 84. The second input terminals of the bank of AND gates 84 are connected to a control line 85. During serial initializing and outputting of signature patterns or numbers, a logic 0 signal on the control line 85 isolates the parallel input terminals $I_1$, $I_2$, ..., $I_N$, in 82, by blocking the bank of AND gates 84. During test data taking, a logic 1 signal on the control line 85 activates the bank of AND gates 84, passing signals on the parallel input terminals 82 to the MISR 80. Each of the parallel input terminals 82 connects to one sequential stage of the MISR 80.

Each sequential stage includes a multiple input parity gate 86, 88, 90 and a flip-flop 94, 96, 98, typically a D-flip-flop. A first input terminal 91 of each parity gate 86, 88, 90 is connected to the output terminal of an earlier stage of the MISR 80, and a second input terminal 92 is connected to one of the parallel input terminals 82. Each parity gate 86, 88, 90 produces a logic signal at an output terminal 93 equal to the parity of the sum of all of the logic signals at the gate's input terminals 91, 92, 103, i.e. the output logic signal is the least significant bit of the binary number that is equal to the arithmetic sum of the binary numbers associated with the logic signals at the input terminals 91, 92, 103 of the parity gate 86, 88, 90. The output terminal of each stage's parity gate 86, 88, 90 connects to the input terminal of the stage's flip-flop 94, 96, 98. The output terminal of each flip-flop 94, 96, 98 connects to the input terminal of the parity gate 86, 88, 90 of the next sequential stage of the MISR 80.

The output terminal of the flip-flop 98 of the last stage is a data output terminal 109 of the MISR 80. The data output terminal 109 is fed back by a line 101 and connections 102, 103 to the input terminals of one or more of the parity gates 86, 88, 90 of the MISR 80. In some embodiments, the feedback line 101 may only be connected to a subset of the parity gates 86, 88, 90. This is illustrated, in FIG. 4, by the second parity gate 88, which does not have its input terminal 91 connected to the feedback line 101. The exact form of the feedback line 101 is not essential to the present invention. A control line 104 and AND gate 105 may be used to isolate the output terminal 109 of the MISR 80 from feeding back to other stages.

Pulses from the clock line 100 activate the flip-flops 94, 96, 98 to store data delivered to the input terminal of each stage and to transmit stored data to the input terminal of the next stage of the MISR 80. During data taking, the feedback line 101 is connected to the output terminal 109 of the last flip-flop 98, and logic data shifts with each clock pulse in a cyclic fashion and is not lost. Test data from the MISR 80 can be serially delivered through the output line 109. Similarly, the initial state of each stage of the MISR 80 can be set to a logic 1 or 0 by serially inputting an initializing logic pattern through an input line 107. The input line 107 and the OR gate 106 may be employed to input the initial pattern. In some embodiments, during either the inputting of an initial pattern into the flip-flops 94, 96, 98 of the MISR 80 or the outputting of a test signature number, the feedback line 101 may be isolated by sending a signal having a value of logic 0 to the control line 104. Inputting or outputting a logic pattern into the stages of the MISR 80 generally involves N clock pulses on the clock line 100.

During the taking of test data, the data previously stored in each stage of the MISR 80 is added by the parity gates 86, 88, 90 to the data arriving on the input terminals 92 of the next stage, i.e. the addition operation of each parity gate 86, 88, 90 typically produces an output logic signal equal to the least significant bit of the arithmetic sum of all of the logic signals at the gate's input terminals 91, 92, 103. The addition of new input data to already stored data of a previous stage ordinarily makes each bit of the signature number stored in the MISR 80 correlated to the input signals on all the parallel input lines 82. During test data taking, the shift of previous data to the input terminal 91 of the next stage is similar to a division operation. The feedback line 101 assures that information contained in the remainder after "dividing," or shifting in the MISR 80, is not lost, but fed back to previous stages. Without the feedback line 101, the information in the signature number would ordinarily be shifted out and effectively lost after a number of data taking cycles equal to the number of parallel input terminals 82. The particular form of the feedback lines 101, 102, 103 and the various stages of the MISR 80 may, however, vary in different embodiments.

Figure 6:
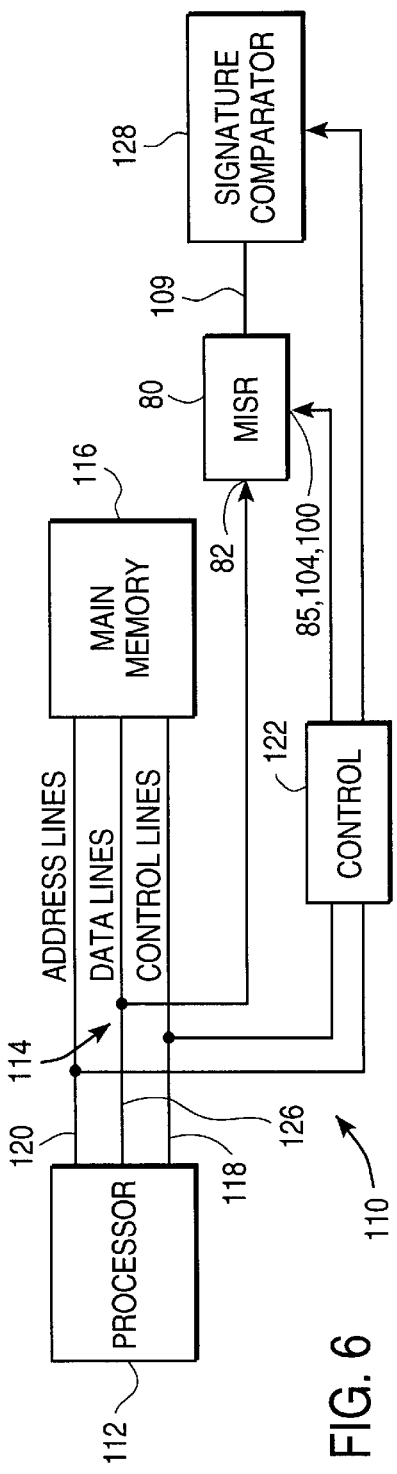
FIG. 6 illustrates an embodiment of an apparatus for performing signature analysis testing at the system level.

FIG. 6 illustrates a high-level block diagram of one embodiment of an apparatus 110 for performing a system-level signature test of a processor 112. The apparatus comprises a MISR 80, a control unit 122, a main memory 116 and a signature comparator 128. The apparatus 110 connects to a bus 114 between the processor 112 and the main memory 116. The main memory 116 is typically a random access memory that does not have variable access times, such as a disk drive. In some embodiments, the main memory 116 may be a cache memory or an input/output device, having assigned addresses therein, to/from which operations performed by the processor are reproducible during a preselected group of time windows. During the test, a complex software program runs on the processor 112. In some embodiments, at least a portion of the complex software employed is compiled in a second memory storage device (not shown) instead of the main memory 116. In some embodiments, the second memory storage device may encounter non-reproducible latencies during input/output operations. In some embodiments, the processor 112 may include several processors that read/write data or perform the preselected triggering events, e.g., bus transactions, on the main memory 116. In some embodiments, the test apparatus 110 is physically separate from the processor 112 and part of the testing equipment machinery of a manufacturing facility.

The control unit 122 monitors the control and address lines 118, 120 of the bus 114. Each address line 120 connects to an input terminal of the control unit 122 so that addresses may be identified for finding the time windows 62, 63 of FIG. 4. Output lines of the control unit 122 connect to the control and clock lines 100, 85, 104 of the MISR 80. These lines 100, 85 104 allow the control unit 122 to enable and disable the parallel input terminals 82. The parallel input terminals 82 connect to data lines 126 of the bus 114. In one embodiment, each data line 126 separately connects to one parallel input terminal 82, thereby increasing the number of bits in the test signature number and decreasing the probability of aliasing. The probability of an alias or false match in the signature number is about $2^{-N}$ where N is the number of parallel input terminals 82. The output line 109 of the MISR 80 connects to an input line of a signature comparator 128. In some embodiments, the signature comparator 128 is enabled by the control unit 122. If the signature in the MISR 80 and expected comparison (or reference) data 128 are identical, then the device is not affected by defects.

Figure 7:
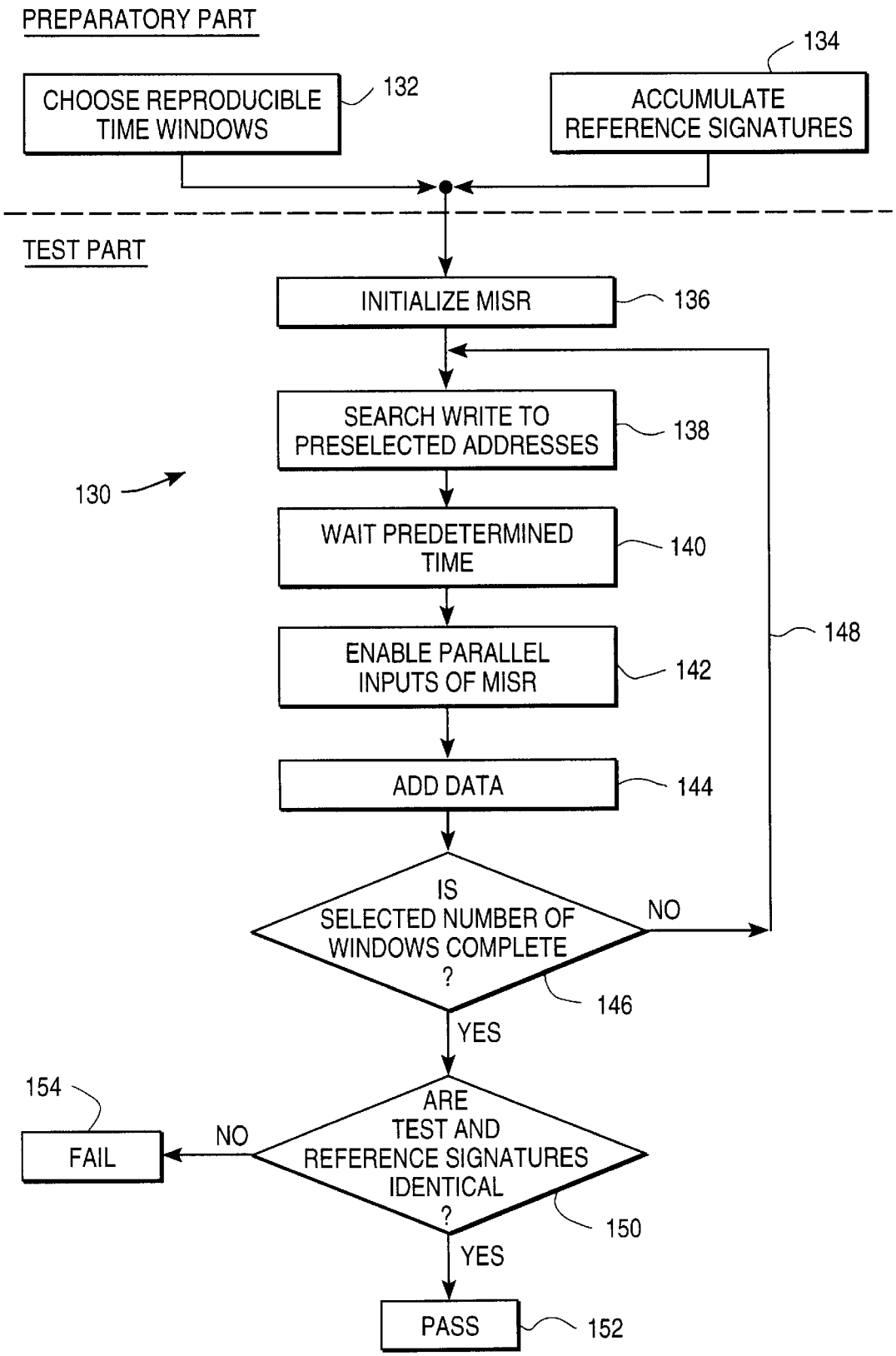
FIG. 7 illustrates the time sequence for accumulating deterministic signature data with the apparatus of FIG. 5.

FIG. 7 illustrates one embodiment for a method 130 of the performing a system-level signature test on the processor 112. The embodiment 130 has two parts. A preparatory part involves performing the test on a known non-defective processor 112 of the type to be tested. At block 132, the preparatory part allows choosing the time windows 62, 63 in which reproducible data is empirically accumulated. At block 134, the preparatory tests accumulate reference signature numbers to be used in the second part of the test. The second part entails actually testing processors 112 that are not known to be defective or non-defective. The preparatory part may be performed once in a laboratory whereas the second part is often performed in a manufacturing environment.

Referring to FIG. 7, the second part of the method 130 is repeated on each processor 112 to be tested. At block 136, the MISR 80 is initialized by inputting a preselected pattern into the sequence of flip-flops 94, 96, 98. In one embodiment, the initial pattern is the same initial pattern used in the block 134 to accumulate a reference signature data. The initial pattern is serially inputted, for example through the line 107 of the MISR 80 of FIG. 5 though other embodiments may initialize the MISR 80 differently. As has been mentioned above, the non-reproducible nature of the operation of the complex software program, e.g. typically software allowing a GUI, causes a different route to be used for initializing the processor 112. The complex software is booted at block 138. In one embodiment, a portion of the complex software is stored in the main memory 116 during the boot up. Then, the control unit 122 searches for a preselected write operation to a first preselected memory address. When the preselected write/read operation, or other preselected triggering event, is performed to the first preselected address, the processor 112 is initialized to a reproducible state. The write operation, or other bus transaction preselected for the triggering event, to the first preselected address 64 (see FIG. 4) starts the first time window for taking reproducible signature data. Since running the complex software adapted to performing system-level tests generally entails some non-reproducible acts, the "time" between the preselected time windows 62, 63 (see FIG. 4) is not predictable. Each time that a write operation, or other bus transactions preselected for the triggering events, is executed to the preselected address 64, 65 or a series of preselected addresses 64, 65, the control unit 122 starts one of the chosen time windows 62, 63.

At block 140, the control unit 122 waits for a predetermined time period after the start of one of the chosen time windows 62, 63. At block 142, the control unit 122 enables the MISR 80 to read logic data on the parallel input terminals 82 at preselected times after the start of the time window by enabling the control line 85 by a control signal having a value of logic 1. At block 144, the MISR 80 adds the logic data on the parallel input terminals 82 to the signature number already stored in the MISR 80. The adding step of block 144 compresses all the test data stored in the MISR 80 by producing a single signature number. In some embodiments, the MISR 80 may add the logic data to the signature number already stored at several preselected times of one time window. At block 146, the control unit 122 determines whether the preselected number of time windows 62, 63 for data accumulation have been completed. If the data accumulation is not complete, the control unit 122 returns along a line 148 to the block 136 and searches for the next chosen time window.

At the block 146, if the control unit 122 determines that the selected number of time windows 62, 63 is complete, the control unit 122 sends a signal having a value of logic 0 to the control lines 104, 85 to isolate the parallel input terminals 82 and, in some embodiments, the feedback line 101 while outputting the test signature number. The test signature number itself is outputted from the MISR 80 by a series of clock pulses along the clock line 100. At block 150, the signal comparator 128 compares the test signature number outputted to the reference signature number from the preparatory part of the test of block 134. If the test and reference signature numbers match, the signal comparator 128 returns a signal of pass at block 152. If the test and the reference signature number do not match the signal comparator 128 returns a signal of fail at block 154.

Figure 8:
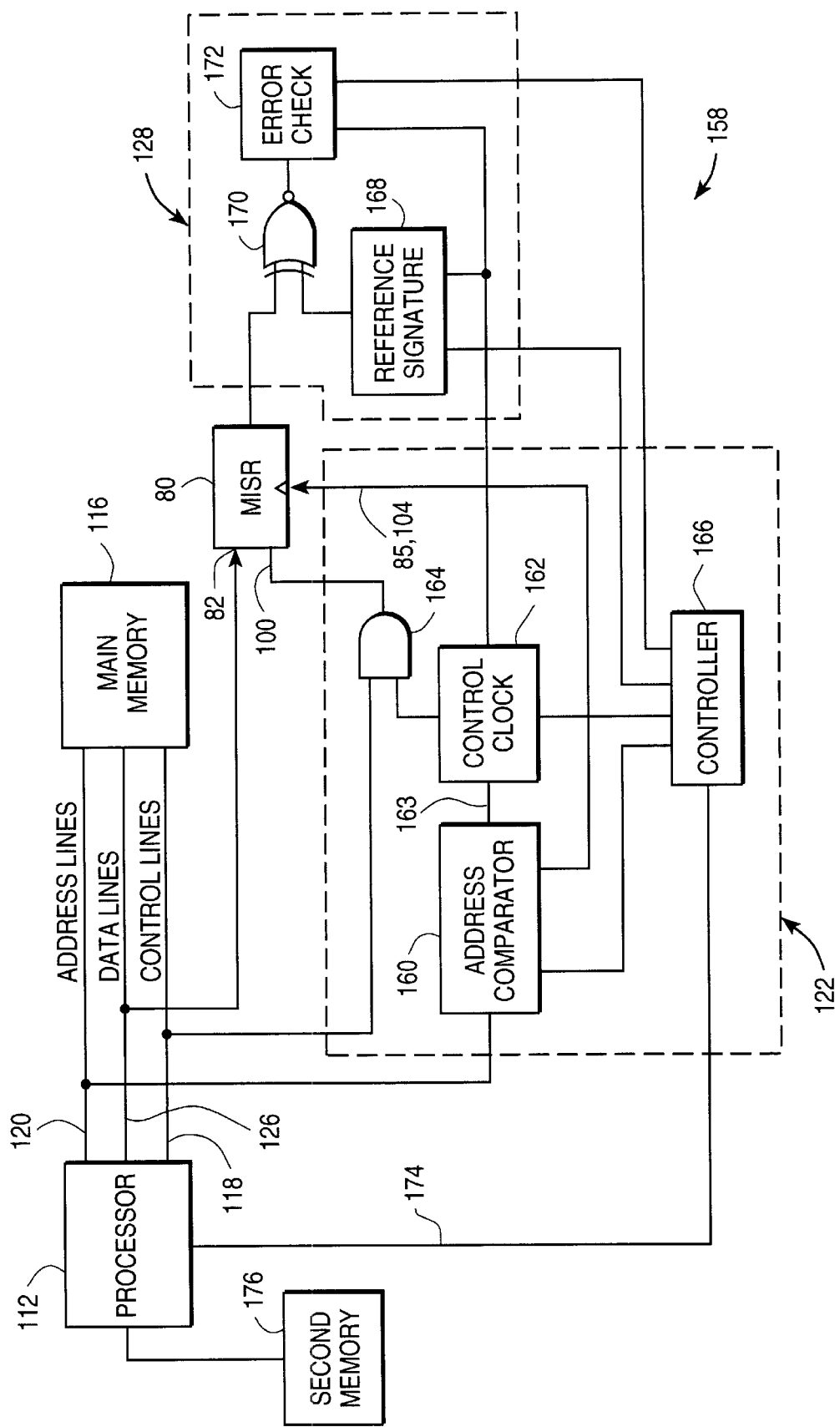
FIG. 8 illustrates an embodiment for a method of performing signature analysis testing at the system level.

FIG. 8 illustrates one embodiment 158 of the control unit 122 and the signature comparator 128 for the test apparatus 110 of FIG. 6. The control unit 110 includes an address comparator 160, a control clock 162, an AND gate 164, and a controller 166. The address comparator 160 is connected to the address lines 120 and is capable of monitoring requests on the bus 114 for the preselected addresses 64, 65 that indicate the start of one of the chosen time windows 62, 63. If a request to one of the preselected addresses 64, 65 is found, the address comparator 160 enables the control clock 162 and the parallel input terminals 82 of the MISR 80 by control lines 163 and 85, respectively. The control clock 162 measures a predetermined time period after being enabled and sends a clock pulse to the AND gate 164. If the request on the bus control line 118 is a write operation, or other bus transaction selected for the triggering event in some embodiments, the output signal from the clock control 162 to the AND gate 164 will have a value of logic 1, enabling the AND gate 164 to transmit the pulse to the clock line 100. The pulse on the clock line 100 enables the flip-flops 94, 96, 98 to store data from the parity gates 86, 88, 90 connected to the parallel input terminals 82 and to transmit data to the subsequent stages of the MISR 80. The control clock 162 may also regulate the serial inputting of the initial pattern and the serial outputting of the test signature number through clock line 100.

FIG. 8 illustrates one embodiment for the signature comparator 128 of FIG. 6. The signature comparator 128 comprises a reference signature register 168, an exclusive NOR gate 170, and an error checker 172. When the controller 166 determines that the preselected number of time windows 62, 63 has been completed, the controller 166 activates the control clock 162, the reference signature register 168, and the error checker 172. The controller 166 also disables the parallel input terminals 82 of the MISR 80 by means of the control line 85 and disables the feedback line 101 by means of the control line 104. Each subsequent clock pulse on the line 100 serially outputs a bit of the test signature number from the MISR 80, and a bit of the reference signature number from the reference signature register 168 to the exclusive NOR gate 170. If the signature numbers from the MISR 80 and the reference signature register 168 match, the exclusive NOR gate 170 outputs a signal having a value of logic 1 and the error checker 172 reports that test is passed. Otherwise, the error checker 172 reports that the processor 112 has failed the test.

Referring to FIG. 8, in some embodiments, the controller 166 has a more direct control over timing or controlling the reproducible time windows 62, 63 of FIG. 4. In one embodiment, a line 174 connects the controller 166 to an interrupt disable port of the processor 112. The line 174 is activated, and interrupts are disabled during the reproducible time windows 62, 63 of FIG. 4 and during the blocks 138, 140, and 142 of FIG. 7. The interrupt disable may disable access to the second memory storage device 176, which contains portions of the software running on the processor 112. Accessing the second memory storage device 176 might otherwise introduce non-reproducible latencies into the acts of the processor 112. This disclosure is intended to cover all variations on the role of the controller 166 that are within the knowledge of an ordinary person in the art in light of the present disclosure.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

What is claimed is:

1. An apparatus for testing a processor running a software program, comprising:

a bus having control, data and address lines;

a device having at least one assigned address, the bus connecting the device to the processor;

a multiple input signature register having a plurality of parallel input terminals connected to the data lines;

a control unit having first and second input terminals connected to the address and control lines respectively, said control unit being adapted to enabling the parallel input terminals of the multiple input signature register in response to detecting on the address and control lines at least one preselected triggering event executed by the software program to a preselected address of the device; and a signature comparator adapted to comparing a test signature number from the multiple input signature register to a reference signature number.

2. The apparatus as set forth in claim 1, wherein the preselected triggering events are bus transactions selected from the group consisting of read acts and write acts.

3. The apparatus as set forth in claim 1, wherein the processor running said software is capable of performing reproducible operations during two time windows starting at two of said preselected triggering events to said preselected address and capable of performing non-reproducible acts at times between said two time windows.

4. The apparatus as set forth in claim 3, wherein the control unit further includes a clock, said clock capable of enabling the multiple input signature register to add data from said parallel input terminals to the test signature number stored therein.

5. The apparatus as set forth in claim 3, wherein the control unit is adapted to enabling the parallel input terminals of the multiple input signature register a plurality of times before enabling the signal comparator to compare the test and reference signature numbers.

6. The apparatus as set forth in claim 1, wherein each of said data lines is individually connected to one of the parallel input terminals of the multiple input signature register.

7. The apparatus as set forth in claim 6, wherein said multiple input signature register comprises a plurality of stages, each stage comprising:

a gate to produce an output logic signal equal to the least significant bit of the arithmetic sum of binary logic signals at input terminals of the gate, one input terminal of each gate connected to one of the parallel input terminals; and a flip-flop, the output terminal of the flip-flop being connected to one of the input terminals of the gate of the next stage and the input terminal of the flip-flop being connected to the output terminal of the gate of the same stage.

8. The apparatus as set forth in claim 7, wherein the output terminal of the last stage of said multiple input signature register is fed back to one of the input terminals of at least one of the gates of one of said earlier stages.

9. The apparatus as set forth in claim 1, wherein said control unit includes an output line connected to an interrupt disable control of said processor, said control unit capable of disabling said processor from responding to interrupts.

10. The apparatus as set forth in claim 1, further comprising a memory storage unit, said software program configured so that portions of said program are always stored on the memory storage unit.

11. The apparatus as set forth in claim 10, wherein said memory storage unit responds to write and read requests with non-reproducible latencies.

12. The apparatus as set forth in claim 1, wherein the device is selected from the group consisting of a random access memory and an input/output device.

13. The apparatus as set forth in claim 1, wherein said control unit comprises:

a control clock capable of enabling said multiple input signature register; and an address comparator having a plurality of input terminals connected to said address lines and capable of starting said control clock and of enabling said parallel input terminals of said multiple input signal register in response to detecting one of the triggering events to one of the preselected addresses on said address lines.

14. A method of performing a signature test on a processor, comprising:

執行 a software program on said processor;

storing an initial test signature number in a multiple input signature register;

monitoring at least some control and address lines of a bus connecting said processor to a device, the monitoring act performed by an address comparator;

adding logic data from at least some of the control lines, the address lines or data lines of the bus to the test signature number stored in the multiple input signature register in response to an occurrence of a preselected triggering event while running the software program; and comparing the test signature number to a reference signature number in a signature comparator.

15. The method as set forth in claim 14, wherein the act of adding is in response to a preselected read or write act to a preselected address of said device.

16. The method as set forth in claim 14, wherein the act of executing said software program includes reading portions of said software program stored on a memory storage and wherein at least some of the acts of reading include non-reproducible latencies.

17. The method as set forth in claim 14, further comprising:

a second act of adding data to the test signature number stored in said multiple input signature register in response to an occurrence of a second preselected triggering event while running the software program; and wherein the act of executing said software program includes non-reproducible acts by said processor between said first and second acts of adding.

18. The method as set forth in claim 14, further comprising the act of disabling the processor from responding to interrupt requests during the acts of adding data.

19. The method as set forth in claim 14, wherein said act of adding data comprises:

receiving data at a first input terminal of a parity gate, said data being a logic signal;

sending an output signal of a flip-flop to a second input terminal of said parity gate concurrently to said act of receiving data; and storing an output signal of said parity gate to a second flip-flop concurrently to said act of sending.

20. The method as set forth in claim 14, wherein said act of comparing comprises sending the test and reference signature numbers to the first and second input terminals of an exclusive NOR gate, said act of comparing includes detecting an error in response to a logic 0 signal at the output terminal of said exclusive NOR gate.

21. The method claim as set forth in claim 14, wherein said act of adding starts at the conclusion of more than one bus transaction between the processor and the device following said preselected triggering event.

22. The method claim as set forth in claim 14, further comprising sending a clock pulse and a control signal to said multiple input signature register in response to said preselected triggering event, said act of adding being in response to said act of sending.

23. The method as set forth in claim 14, further comprising running said software program on at least one reference processor to find one or more time windows, said time windows triggered by said preselected triggering events, all events performed by said reference processors being reproducible during said time windows.

24. An apparatus for testing a processor, comprising:

a bus having control, data and address lines;

a first memory, said bus coupling the first memory to the processor;

a second memory being coupled to the processor and storing software executable on the processor;

a multiple input signature register having a plurality of parallel input terminals connected to the data lines, having an output terminal and being adapted to storing a test signature number;

a control unit connected to the address and control lines, the control unit adapted to enabling the multiple input signature register to add logic data on the parallel input terminals to the test signature number in response to detecting at least one type of particular bus transaction to a particular preselected address while running the software; and a signature comparator coupled to the output terminal to compare the test signature number to a reference signature number in response to being enabled by the control unit.

25. The apparatus as set forth in claim 24, wherein said processor is capable of performing reproducible bus transactions during time windows starting at each of said particular bus transactions and of performing non-reproducible bus transactions during time intervals between two of said time windows.

26. The apparatus as set forth in claim 25, wherein the control unit further includes a control clock capable of enabling the multiple input signature register to add said logic data to the test signature number.

27. The apparatus as set forth in claim 26, wherein the control unit and the control clock are adapted to enabling the parallel input terminals of the multiple input signature register a plurality of times before said control unit and said control clock enable the signal comparator to compare said test and reference signature numbers.

28. The apparatus as set forth in claim 27, wherein said multiple input signature register comprises a plurality of stages, each stage comprising:

a gate to produce an output signal equal to the parity of the arithmetic sum of logic signals at input terminals to the gate, one of the input terminals of each gate coupling to one of the parallel input terminals; and a flip-flop, the output terminal of the flip-flop being connected to one of the input terminals of the gate associated with the next stage and the input terminal of the flip-flop being connected to the output terminal of the gate of the same stage.

29. The apparatus as set forth in claim 24, wherein each of said data lines is individually connected to one of the parallel input terminals of the multiple input signature register.

30. The apparatus as set forth in claim 24, wherein said second memory responds to read and write requests with non-reproducible latencies.

* * * * *